(12) United States Patent
Muto et al.

(10) Patent No.: US 11,970,639 B2
(45) Date of Patent: *Apr. 30, 2024

(54) TEMPORARY ADHESIVE FOR WAFER PROCESSING, WAFER LAMINATE AND METHOD FOR PRODUCING THIN WAFER

(71) Applicant: Shin-Etsu Chemical Co., Ltd., Tokyo (JP)

(72) Inventors: Mitsuo Muto, Annaka (JP); Michihiro Sugo, Annaka (JP); Shohei Tagami, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/921,440

(22) PCT Filed: Apr. 22, 2021

(86) PCT No.: PCT/JP2021/016272
§ 371 (c)(1),
(2) Date: Oct. 26, 2022

(87) PCT Pub. No.: WO2021/220929
PCT Pub. Date: Nov. 4, 2021

(65) Prior Publication Data
US 2023/0088354 A1 Mar. 23, 2023

(30) Foreign Application Priority Data
Apr. 30, 2020 (JP) ................. 2020-080245

(51) Int. Cl.
*B32B 7/12* (2006.01)
*C09J 7/38* (2018.01)
(Continued)

(52) U.S. Cl.
CPC ............... *C09J 183/06* (2013.01); *B32B 7/12* (2013.01); *C09J 7/38* (2018.01); *C09J 11/08* (2013.01);
(Continued)

(58) Field of Classification Search
CPC ..... B32B 7/12; B32B 9/005; B32B 2307/748; C09J 7/38; C09J 183/04
See application file for complete search history.

(56) References Cited

U.S. PATENT DOCUMENTS

| 7,541,264 B2 | 6/2009 | Gardner et al. |
| 2008/0014532 A1 | 1/2008 | Kessel et al. |

(Continued)

FOREIGN PATENT DOCUMENTS

| JP | 2004-64040 A | 2/2004 |
| JP | 2006-328104 A | 12/2006 |

(Continued)

OTHER PUBLICATIONS

International Search Report dated Aug. 3, 2021, issued in counterpart International Application No. PCT/JP2021/016272 (3 pages).

*Primary Examiner* — Elizabeth E Mulvaney
(74) *Attorney, Agent, or Firm* — WHDA, LLP

(57) ABSTRACT

The present invention provides: a temporary adhesive for wafer processing, said temporary adhesive being used for the purpose of provisionally bonding a wafer to a support, while being composed of a photocurable silicone resin composition that contains a non-functional organopolysiloxane; a wafer processed body; and a method for producing a thin wafer, said method using a temporary adhesive for wafer processing.

7 Claims, 1 Drawing Sheet

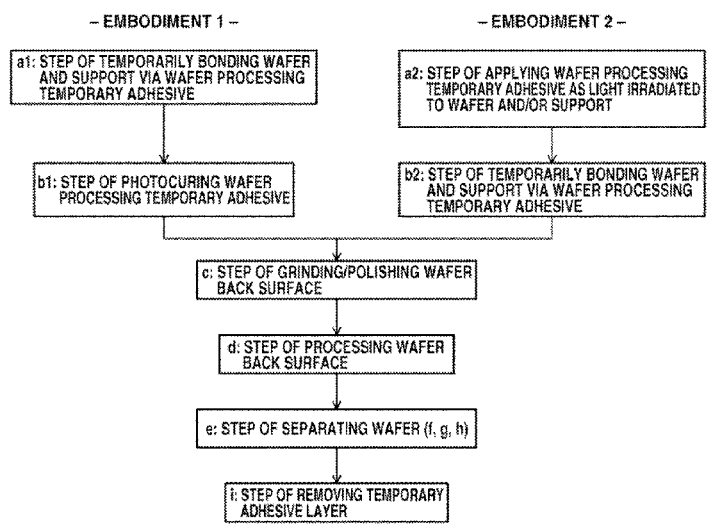

(51) Int. Cl.
*C09J 11/08* (2006.01)
*C09J 183/06* (2006.01)
*H01L 21/683* (2006.01)
*B32B 9/00* (2006.01)
*B32B 9/04* (2006.01)
*B32B 17/06* (2006.01)
*B32B 38/00* (2006.01)

(52) U.S. Cl.
CPC .......... *H01L 21/6836* (2013.01); *B32B 9/005* (2013.01); *B32B 9/04* (2013.01); *B32B 17/06* (2013.01); *B32B 2038/0016* (2013.01); *B32B 2255/26* (2013.01); *B32B 2307/748* (2013.01); *B32B 2457/14* (2013.01)

(56) References Cited

U.S. PATENT DOCUMENTS

| | | | |
|---|---|---|---|
| 2011/0297771 | A1 | 12/2011 | Noda et al. |
| 2014/0150972 | A1 | 6/2014 | Koellnberger et al. |
| 2016/0189998 | A1 | 6/2016 | Yasuda et al. |
| 2019/0164802 | A1* | 5/2019 | Ogino ................. C09J 5/06 |

FOREIGN PATENT DOCUMENTS

| | | | |
|---|---|---|---|
| JP | 2009-543708 | A | 12/2009 |
| JP | 2014-525953 | A | 10/2014 |
| JP | 2016-119438 | A | 6/2016 |
| JP | 2020-29519 | A | 2/2020 |
| WO | 2017/191815 | A1 | 11/2017 |
| WO | 2020/050167 | A1 | 3/2020 |

* cited by examiner

– EMBODIMENT 1 – a1: STEP OF TEMPORARILY BONDING WAFER AND SUPPORT VIA WAFER PROCESSING TEMPORARY ADHESIVE

↓ b1: STEP OF PHOTOCURING WAFER PROCESSING TEMPORARY ADHESIVE

– EMBODIMENT 2 – a2: STEP OF APPLYING WAFER PROCESSING TEMPORARY ADHESIVE AS LIGHT IRRADIATED TO WAFER AND/OR SUPPORT

↓ b2: STEP OF TEMPORARILY BONDING WAFER AND SUPPORT VIA WAFER PROCESSING TEMPORARY ADHESIVE

↓ c: STEP OF GRINDING/POLISHING WAFER BACK SURFACE

↓ d: STEP OF PROCESSING WAFER BACK SURFACE

↓ e: STEP OF SEPARATING WAFER (f, g, h)

↓ i: STEP OF REMOVING TEMPORARY ADHESIVE LAYER

TEMPORARY ADHESIVE FOR WAFER PROCESSING, WAFER LAMINATE AND METHOD FOR PRODUCING THIN WAFER

TECHNICAL FIELD

This invention relates to a wafer processing temporary adhesive, a wafer laminate, and a method for manufacturing a thin wafer.

BACKGROUND ART

Three-dimensional semiconductor packages become essential for accomplishing a higher density and capacity. The 3D semiconductor packaging technology is by thinning semiconductor chips individually, and stacking them in multilayer structure while providing through-silicon via (TSV) interconnects. Fabrication of such packages requires the steps of thinning a substrate having a semiconductor circuit formed therein by grinding its non-circuit forming surface or back surface, and forming TSV and electrodes on the back surface. In the prior art, the step of grinding the back surface of a silicon substrate includes attaching a protective tape to the surface of the substrate opposite to the surface to be ground for preventing the wafer from breakage during the grinding step. Since the protective tape uses an organic resin film as the support substrate, it is flexible, but has insufficient strength and heat resistance to withstand the TSV forming step and the step of forming interconnects on the back surface.

It is then proposed to bond a semiconductor substrate to a support of silicon, glass or the like via an adhesive layer. The resulting system is sufficient to withstand the steps of grinding the back surface and forming TSV and electrodes on the back surface. The adhesive layer for bonding the substrate to the support is critical for this system. The adhesive layer must bond the substrate to the support without leaving gaps, be durable enough to withstand the subsequent steps, and eventually allow the thin wafer to be readily released from the support. Herein, the adhesive layer is referred to as "temporary adhesive layer" since it is finally released.

With regard to well-known temporary adhesive layers and release thereof, Patent Document 1 discloses a layer of an adhesive containing a light absorbing substance. The adhesive layer is irradiated with high intensity light for decomposing the adhesive layer so that the adhesive layer may be removed from the support. Patent Document 2 discloses an adhesive comprising a heat-fusible hydrocarbon compound, wherein the adhesive can be bonded and released in the heat fused condition. The former technology undesirably requires an expensive tool such as laser and a longer time of treatment per substrate. The latter technology is simple because of control solely by heat, but is applicable to only a limited range because of insufficient thermal stability at high temperatures in excess of 200° C. These temporary adhesive layers are not adequate to form a layer of uniform thickness on a heavily stepped substrate and to provide a complete bond to the support.

The use of a silicone pressure-sensitive adhesive as the temporary adhesive layer is proposed in Patent Document 3. A substrate is bonded to a support with a heat-curable silicone pressure sensitive adhesive. On removal, the assembly is immersed in an etching solution capable of dissolving or decomposing the silicone resin, whereby the substrate is separated from the support. This method takes a very long time for removal and is difficult to apply to the commercial manufacture process. Also, a long time is necessary to wash away the silicone adhesive which is left as residues on the substrate after removal, posing a problem in terms of washaway. On the other hand, in the case of heat-curable silicone, the bonding step needs heating at about 150° C. Particularly when the wafer is heated on a hot plate, a problem of wafer warpage arises. An attempt to establish a bond at low temperature to prevent the wafer from warpage encounters a problem that a long time is necessary until the cure is complete.

PRIOR ART DOCUMENTS

Patent Documents

Patent Document 1: JP-A 2004-64040
Patent Document 2: JP-A 2006-328104
Patent Document 3: U.S. Pat. No. 7,541,264

SUMMARY OF INVENTION

Technical Problem

An object of the invention, which has been made in view of the above-mentioned problems, is to provide a wafer processing temporary adhesive, a wafer laminate, and a method for manufacturing a thin wafer, which can bond a substrate to a support at a relatively low temperature within a short time, thereby improving working efficiency and preventing wafer warpage in the bonding step and which ensures sufficient substrate holding after bonding even on use of a heavily stepped substrate, is well compatible with steps including wafer back surface grinding step, TSV forming step, and wafer back surface interconnecting step, has resistance to wafer thermal processing, allows for easy peeling in release step, is easy in washing away adhesive residues on the substrate after release, and offers high productivity in the manufacture of thin wafers.

Solution to Problem

Making extensive investigations to overcome the outstanding problems, the inventors have found that the problems are solved by using a photocurable silicone resin composition containing a non-functional organopolysiloxane to construct a temporary adhesive. The invention is predicated on this finding.

Accordingly, the invention provides a wafer processing temporary adhesive, a wafer laminate, and a method for manufacturing a thin wafer, as defined below.

1. A wafer processing temporary adhesive for temporarily bonding a wafer to a support, comprising a photocurable silicone resin composition containing a non-functional organopolysiloxane.

2. The wafer processing temporary adhesive of 1 wherein the photocurable silicone resin composition comprises:
   (A) 100 parts by weight of an organopolysiloxane having at least two alkenyl groups to per molecule,
   (B) an organohydrogenpolysiloxane having at least two silicon-bonded hydrogen atoms (i.e., SiH groups) per molecule, in such an amount that a molar ratio of the total of SiH groups in component (B) to the total of alkenyl groups in component (A) is from 0.3 to 10,
   (C) 0.1 to 200 parts by weight of a non-functional organopolysiloxane, and (D) a photo-activatable hydrosilylation reaction catalyst in such an amount as to provide 0.1 to 5,000 ppm of metal atom based on the total weight of components (A), (B), and (C).

3. The wafer processing temporary adhesive of 2 wherein the non-functional organopolysiloxane as component (C) has a viscosity of 100 to 500,000 mPa·s as measured in 30% by weight toluene solution at 25° C.

4. The wafer processing temporary adhesive of any one of 1 to 3 wherein the photocurable silicone resin composition further comprises (E) a hydrosilylation reaction inhibitor in an amount of 0.001 to 10 parts by weight relative to the total weight of components (A), (B), and (C).

5. The wafer processing temporary adhesive of any one of 1 to 4 wherein the photocurable silicone resin composition shows a 180° peeling force of from 2 gf to 50 gf when tested by curing the photocurable silicone resin composition to form a test film of 25 mm wide, bonding the test film to a silicon substrate, and peeling back the film at 180° and 25° C.

6. The wafer processing temporary adhesive of any one of 1 to 5 wherein the photocurable silicone resin composition as cured has a storage elastic modulus at 25° C. of from 1,000 Pa to 1,000 MPa.

7. A method for manufacturing a thin wafer, comprising the following steps (a) to (e) using a photocurable silicone resin composition containing a non-functional organopolysiloxane, wherein
the steps (a) and (b) of bonding a wafer to a support via a temporary adhesive layer and curing are performed in either one of the following embodiments, and steps (c) to (e) are common in both the embodiments, embodiment (1):

(a1) providing a wafer having a circuit-forming surface on a front side and a non-circuit-forming surface on a back side, applying the wafer processing temporary adhesive of any one of 1 to 6 to the circuit-forming surface of the wafer and/or the wafer-facing surface of the support and bonding them to construct a wafer laminate, (b1) photocuring the temporary adhesive in the wafer laminate, embodiment (2):

(a2) irradiating light to the wafer processing temporary adhesive composition of is any one of 1 to 6.

(b2) providing a wafer having a circuit-forming surface on a front side and a non-circuit-forming surface on a back side, applying the irradiated wafer processing temporary adhesive composition from step (a-2) to the circuit-forming surface of the wafer and/or the wafer-facing surface of the support and bonding them to construct a wafer laminate, (c) grinding or polishing the non-circuit-forming surface of the wafer in the wafer laminate, (d) processing the non-circuit-forming surface of the wafer, and (e) peeling the processed wafer from the support.

8. A wafer laminate comprising a support, a temporary adhesive layer disposed thereon and obtained from the wafer processing temporary adhesive of any one of 1 to 6, and a wafer disposed thereon, the wafer having a circuit-forming surface on a front side and a non-circuit-forming surface on a back side,
the temporary adhesive layer being releasably bonded to the front surface of the wafer.

Advantageous Effects of Invention

The wafer processing temporary adhesive of the invention using a photocurable silicone resin composition containing a non-functional organopolysiloxane can bond a substrate at relatively low temperature and within a short time by light irradiation, whereby the wafer is prevented from warpage and the bonding time is shortened. After bonding, the resin remains fully heat resistant in that the resin is not thermally decomposed, especially the resin does not flow even at high temperatures in excess of 200° C. Therefore, the temporary adhesive is applicable to a wide spectrum of semiconductor film-forming process, is highly resistant to chemical vapor deposition (CVD), and forms a temporary adhesive layer having high uniformity of film thickness even on a stepped wafer. By virtue of the film thickness uniformity, a uniform thin wafer of up to 50 µm thick can be easily manufactured. The temporary adhesive using the non-functional organopolysiloxane is improved in peeling or release. After a thin wafer is produced, the wafer can be easily released from the support, for example, at room temperature, that is, a fragile thin wafer can be easily manufactured. Since the temporary adhesive is selectively bondable to the support, no residues of the temporary adhesive are left on the thin wafer after release, and the subsequent washing away step is effective. By the wafer manufacturing method of the invention, thin wafers having a TSV structure or hump interconnect structure can be easily manufactured.

BRIEF DESCRIPTION OF DRAWINGS

FIG. 1 is a flow chart illustrating steps of the thin wafer manufacturing method of the invention.

DESCRIPTION OF EMBODIMENTS

Wafer Processing Temporary Adhesive

The invention provides a wafer processing temporary adhesive comprising a photocurable silicone resin composition containing a non-functional organopolysiloxane. In view of application to stepped silicon wafers or the like, the silicone resin composition having a spin coating ability is advantageously used as the wafer processing temporary adhesive.

The photocurable silicone resin composition is preferably defined as comprising the following components (A) to (D):

(A) 100 parts by weight of an organopolysiloxane having at least two alkenyl groups per molecule, (B) an organohydrogenpolysiloxane containing at least two silicon-bonded hydrogen atoms (i.e., SiH groups) per molecule, in such an amount that a molar ratio of the total of SiH groups in component (B) to the total of alkenyl groups in component (A) is from 0.3/1 to 10/1, (C) 0.1 to 200 parts by weight of a non-functional organopolysiloxane, and (D) a photo-activatable hydrosilylation reaction catalyst in such an amount as to provide 0.1 to 5,000 ppm of metal atom based on the total weight of components (A), (B), and (C).

Component (A)

Component (A) is an organopolysiloxane having at least two alkenyl groups per molecule. Examples of component (A) include linear or branched diorganopolysiloxanes containing at least two alkenyl groups per molecule, and organopolysiloxanes of three-dimensional network structure containing at least two alkenyl groups per molecule and siloxane units (Q units) represented by $SiO_{4/2}$ units. Of these, those diorganopolysiloxanes or organopolysiloxanes of three-dimensional network structure having an alkenyl content of 0.6 to 9 mol % are preferred. As used herein, the alkenyl content is a ratio (mol %) of the number of alkenyl groups to the number of silicon atoms in the molecule.

Examples of the organopolysiloxane include those having the following formulae (A-1), (A-2) and (A-3), which may be used alone or in admixture of two or more.

[Chem. 1]

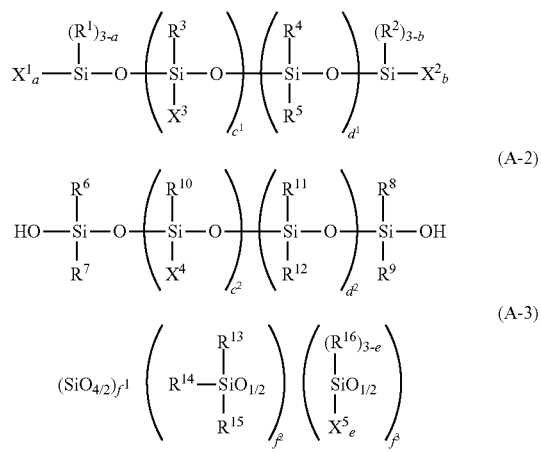

In formulae (A-1) to (A-3), $R^1$ to $R^{16}$ are each independently selected from monovalent hydrocarbon groups exclusive of aliphatic unsaturated hydrocarbon groups. $X^1$ to $X^5$ are each independently selected from alkenyl-containing monovalent organic groups.

In formula (A-1), "a" and "b" are each independently an integer of 0 to 3. In formulae (A-1) and (A-2), $c^1$, $c^2$, $d^1$ and $d^2$ are integers in the range: $0 \leq c^1 \leq 10$, $2 \leq c^2 \leq 10$, $0 \leq d^1 \leq 100$, $0 \leq d^2 \leq 100$, and $a+b+c^1 \geq 2$. The subscripts a, b, $c^1$, $c^2$, $d^1$ and $d^2$ are preferably integers combined so as to provide an alkenyl content of 0.6 to 9 mol %.

In formula (A-3), e is an integer of 1 to 3, $f^1$, $f^2$ and $f^3$ are such numbers that $(f^2+f^3)/f^1$ is from 0.3 to 3.0 and $f^3/(f^1+F^2+F^3)$ is from 0.01 to 0.6.

The monovalent hydrocarbon groups exclusive of aliphatic unsaturated hydrocarbon groups are preferably of 1 to 10 carbon atoms. Examples include alkyl groups such as methyl, ethyl, n-propyl, isopropyl, n-butyl, tert-butyl, n-pentyl, n-hexyl; cycloalkyl groups such as cyclopentyl and cyclohexyl; and aryl groups such as phenyl and tolyl. Inter alia, alkyl groups such as methyl and phenyl groups are preferred.

The alkenyl-containing monovalent organic groups are preferably of 2 to 10 carbon atoms. Typical are alkenyl groups such as vinyl, allyl, hexenyl and octenyl; (meth) acryloylalkyl groups such as acryloylpropyl, acryloylethyl, acryloylmethyl, and methacrylolpropyl; (meth)acryloxyalkyl groups such as acryloxypropyl, acryloxyethyl, acryloxymethyl, methacryloxypropyl, methacryloxyethyl and methacryloxymethyl; and alkenyl-containing monovalent hydrocarbon groups such as cyclohexenylethyl and vinyloxypropyl. Inter alia, vinyl is preferred from the industrial aspect.

In formula (A-1), "a" and "b" are each independently an integer of 0 to 3. It is preferred that each of "a" and "b" be an integer of 1 to 3, because the molecular chain end(s) is capped with alkenyl, and the reaction can be completed in a short time with highly reactive molecular chain end alkenyl group(s). From the economy aspect, it is industrially preferred that "a" and "b" be equal to 1. The alkenyl-containing diorganopolysiloxane having formula (A-1) or (A-2) is preferably oily or gum-like.

The organopolysiloxane having formula (A-3) is of three-dimensional network structure and contains $SiO_{4/2}$ units. In formula (A-3), "e" is each independently an integer of 1 to 3. From the economy aspect, it is industrially preferred that "e" be equal to 1. Also preferably, the average value of e multiplied by the value of $f^3(f^1+f^4+f^3)$ is from 0.02 to 1.5, more preferably from 0.03 to 1.0. The organopolysiloxane having formula (A-3) may be used as a solution in an organic solvent.

The organopolysiloxane as component (A) should preferably have a number average molecular weight (Mn) of 100 to 1,000,000, more preferably 1,000 to 100,000. This range of Mn ensures that the composition is satisfactory in working in terms of viscosity and processing in terms of storage elastic modulus after curing. As used herein, Mn is measured by gel permeation chromatography (GPC) versus polystyrene standards using toluene solvent.

Component (A) may be used alone or in admixture of two or more. Especially, a mixture of an organopolysiloxane haling formula (A-1) and an organopolysiloxane having formula (A-3) is preferred. In the mixture, the amount of the organopolysiloxane having formula (A-3) is preferably 1 to 1,000 parts by weight, more preferably 10 to 500 parts by weight per 100 parts by weight of the organopolysiloxane having formula (A-1).

Component (B)

Component (B), which serves as a crosslinker, is an organohydrogenpolysiloxane containing at least two, preferably at least three silicon-bonded hydrogen atoms (i.e., SiH groups) per molecule. The organohydrogenpolysiloxane may be straight, branched or cyclic and may be used alone or in admixture of two or more.

The organohydrogenpolysiloxane as component (B) should preferably have a viscosity at 25° C. of 1 to 5,000 mPa·s, more preferably 5 to 500 mPa·s. As used herein, the viscosity is measured at 25° C. by a rotational viscometer.

The organohydrogenpolysiloxane as component (B) should preferably have a Mn of 100 to 100,000, more preferably 500 to 10,000. This range of Mn ensures that the composition is satisfactory in working in terms of viscosity and processing in terms of storage elastic modulus after curing.

Component (B) is blended in such an amount that a molar ratio of the total of SiH groups in component (B) to the total of alkenyl groups in component (A), that is, a molar ratio of SiH groups/alkenyl groups is from 0.3 to 10, more preferably from 1.0 to 8.0. As long as the molar ratio is at least 0.3, the problems that the crosslinking density becomes lower and a temporary adhesive layer does not cure do not arise. Also, as long as the molar ratio is up to 10, the crosslinking density does not become excessively high, a satisfactory bonding force and tack are obtained, and the pot life of a treating solution is prolonged.

Component (C)

Component (C) is a non-functional organopolysiloxane. As used herein, the term "non-functional" means that the compound does not possess in its molecule any reactive group (bonded to a silicon atom directly or via an arbitrary group) such as alkenyl group, hydrogen atom, hydroxy group, alkoxy group, halogen atom, or epoxy group.

Suitable non-functional organopolysiloxanes include organopolysiloxanes having an unsubstituted or substituted monovalent hydrocarbon group of 1 to 12 carbon atoms, preferably 1 to 10 carbon atoms, exclusive of aliphatic unsaturated hydrocarbon group. Examples of the monovalent hydrocarbon group include alkyl groups such as methyl, ethyl, propyl, butyl, pentyl, hexyl and heptyl; cycloalkyl groups such as cyclohexyl; aryl groups such as phenyl, tolyl, xylyl and naphthyl; and aralkyl groups such as benzyl and phenethyl. Some or all of the hydrogen atoms in these groups may be substituted by halogen atoms such as chlorine, fluorine or bromine atoms. Examples of such substituted groups include halogenated alkyl groups such as chloromethyl, 3-chloropropyl and 3,3,3-trifluoropropyl. Of the foregoing monovalent hydrocarbon groups, alkyl and aryl groups are preferred, with methyl and phenyl being more preferred.

The molecular structure of the non-functional organopolysiloxane as component (C) is not particularly limited and may be straight, branched or cyclic. A straight or branched organopolysiloxane is preferred, and a straight diorganopolysiloxane whose backbone is composed mainly of repeating diorganosiloxane units and which is capped with triorganosiloxy groups at ends of the molecular chain is most preferred.

The non-functional organopolysiloxane as component (C) is preferably such that a 30% by weight toluene solution thereof has a viscosity at 25'C. of 100 to 500,000 mPa·s, more preferably 200 to 100,000 mPa·s, as viewed from ease of working of the composition, ease of coating to a substrate, dynamic properties of a cured product, and peeling from a support. A viscosity in the range indicates an adequate molecular weight, which eliminates the likelihood that the organopolysiloxane volatilizes off in the step of heat curing the silicone resin composition, failing to obtain the desired effect, causes to crack the wafer in the wafer thermal processing step such as CVD. Additionally, the efficiency of working and coating is good.

Examples of the non-functional organopolysiloxane include molecular chain both end trimethylsiloxy-capped dimethylsiloxane polymers, molecular chain both end trimethylsiloxy-capped phenylmethylsiloxane, molecular chain both end trimethylsiloxy-capped 3,3,3-trifluoropropylmethylsiloxane polymers, molecular chain both end trimethylsiloxy-capped dimethylsiloxaneimethylphenylsiloxane copolymers, molecular chain both end trimethylsiloxy-capped dimethylsiloxane/3,3,3-trifluoropropyhnethyl copolymers, molecular chain both end trimethylsiloxy-capped methylphenylsiloxane/3,3,3-tiftluoropropyhriethyl copolymers, molecular chain both end trimethylsiloxy-capped dimethylsiloxane/3,3,3trifluoropropylmethylsiloxane/methylphenylsiloxane copolymers, molecular chain both end dimethylphenylsiloxy-capped dimethylpolysiloxane, molecular chain both end dimethylphenylsiloxy-capped methylphenylpolysiloxane, and molecular chain both end dimethylphenylsiloxy-capped dimethylsiloxane/methylphenylsiloxane copolymers.

The non-functional organopolysiloxane as component (C) may be used alone or in admixture of two or more. It is preferably oily or gum-like in nature.

Component (D)

Component (D) is a photo-activatable hydrosilylation reaction catalyst, which is activated by irradiating light, especially ultraviolet radiation of wavelength 300 to 400 nm, to promote addition reaction between alkenyl groups in component (A) and Si—H groups in component (B). The promoting effect is dependent on temperature, and a better promoting effect is obtained at a higher temperature. It is thus preferable that after light irradiation, the composition is used in an environment at a temperature of 0 to 200° C., more preferably 10 to 100° C. because the reaction is completed within an adequate time.

The photo-activatable hydrosilylation reaction catalyst is mainly selected from platinum group metal base catalysts and iron group metal base catalysts. Suitable platinum group metal base catalysts include complexes of platinum group metals such as platinum, palladium and rhodium, and suitable iron group metal base catalysts include complexes of iron group metals such as nickel, iron and cobalt. Of these, the platinum group metal complexes are often used because they are relatively readily available and exhibit satisfactory catalytic activity.

Those ligands exhibiting catalytic activity in response to UV radiation of medium to long wavelength, specifically UV-B to UV-A are preferred in that they cause little damage to the wafer. Such ligands include cyclic diene ligands and β-diketonato ligands.

The photo-activatable hydrosilylation reaction catalysts which are preferred in this context are given below. Examples of the cyclic diene ligand catalyst include ($\eta^5$-cyclopentadienyl)tri(σ-alkyl) platinum(IV) complexes, specifically (methylcyclopentadienyl)trimethyl platinum(IV), (cyclopentadienyl)trimethyl platinum(IV), (1,2,3,4,5-pentamethylcyclopentadienyl)trimethyl platinum(IV), (cyclopentadienyl)dimethylethyl platinum(IV), (cyclopentadienyl) dimethalacetyl platinum(IV), (trimethylsilylcyclopentadienyl)trimethyl platinum(IV), (methoxycarbonylcyclopentadienyl)trimethyl platimun (IV), and (dimethylphenylsilylcyclopentadienyl)trimethyl platinum(IV). Examples of the β-diketonato ligand catalyst include β-diketonato platinum(II) or platinum(IV) complexes, specifically trimethyl(acetylacetonato)platinum(IV), trimethyl(3,5-heptanedionate) platinum(IV), trimethyl(methylacetoacetate) platinum(IV), bis(2,4-pentanedionato)platinum(II), bis(2,4-hexanedionato)platinum(II), bis(2,4-heptanedionato)platinum(II), bis(3,5-heptanedionato)platinum(II), bis(1-phenyl-1,3-butanedionato)platinum(II), bis(1,3-diphenyl-1,3-propanedionato)platinum(II), and bis(hexafluoroacetylacetonato)platinum(II).

On use, when these catalysts are solid, they may be used in the solid state. In the preferred procedure, however, the catalyst is dissolved in a suitable solvent and used as a compatible mixture with the alkenyl-containing organopolysiloxane as component (A) because a more uniform cured product is obtainable.

Suitable solvents include isononane, toluene, and 2-(2-butoxyethoxy)ethyl acetate.

The amount of component (D) added is a catalytic amount. It is typically used in an amount to provide 0.1 to 5,000 ppm, preferably 0.5 to 2,000 ppm, more preferably 1 to 500 ppm of platinum (or calculated as metal atoms) based on the total weight of components (A), (B) and (C). An amount of at least 0.1 ppm eliminates the risk that the composition is degraded in cure, crosslinking density or holding force. As long as the amount is up to 0.5%, the pot life of the treating solution is prolonged.

Component (E)

The photocurable silicone resin composition may further comprise (E) a reaction inhibitor. The reaction inhibitor is optionally added, if necessary, for preventing the composition from thickening or gelling when the composition is prepared or coated to a substrate.

Examples of the reaction inhibitor include 3-methyl-1-butyn-3-ol, 3-methyl-1-pentyn-3-ol, 1-ethynylcyclohexanol, 3-methyl-3-trimethylsiloxy-1-butyne, 3-methyl-3-trimethylsiloxy-1-pentyne, 3,5-dimethyl-3-trimethylsiloxy-1-hexyne, 1-ethynyl-1-trimethylsiloxycyclohexane, bis(2,2-dimethyl-3-butynyloxy)dimethylsilane, 1,3,5,7-tetramethyl-1,3,5,7-tetravinylcyclotetrasiloxane, and 1,1,3,3-tetramethyl-1,3-divinyldisiloxane. Inter alia, 1-ethynylcyclohexanol and 3-methyl-1-butyn-3-ol are preferred.

In the embodiment wherein the photocurable silicone resin composition contains component (E), the amount of component (E) added should be adjusted optimum because its reaction controlling ability varies depending on a particular chemical structure. In view of influences on cure, storage stability, and cured physical properties, the amount of component (E) is preferably 0.001 to 10 parts by weight, more preferably 0.01 to 10 parts by weight relative to the total weight of components (A), (B) and (C). As long as the amount of component (E) is in the range, the composition has a long service life and long-term storage stability and is efficient in curing and working.

To the photocurable silicone resin composition, there may be added an organpolysiloxane comprising $R^A{}_3SiO_{0.5}$ units wherein $R^A$ is each independently a $C_1$-$C_{10}$ unsubstituted or substituted monovalent hydrocarbon group, and $SiO_2$ units in a molar ratio of $R^A{}_3SiO_{0.5}$ units to $SiO_2$ units (i.e., $R^A{}_3SiO_{0.5}/SiO_2$) of from 0.3 to 1.8. The amount of the organopolysiloxane added is preferably 0 to 500 parts by weight, more preferably more than 0 to 300 parts by weight per 100 parts by weight of component (A).

To the photocurable silicone resin composition, a filler such as silica may be added for further enhancing the heat resistance of a temporary adhesive layer thereof insofar as the capability of the composition is not compromised.

The photocurable silicone resin composition may be used in solution form after a solvent is added thereto, for the purposes of lowering the viscosity of the composition to achieve improvements in working and mixing of the composition, and for adjusting the film thickness of a temporary adhesive layer. The solvent used herein is not particularly limited as long as the foregoing components are dissolved therein. Hydrocarbon solvents are preferred, for example, pentane, hexane, cyclohexane, isooctane, nonane, decane, p-menthane, pinene, isododecane, and limonene.

The solution of the photocurable silicone resin composition is formed, for example, by a method of preparing the composition and finally adding a solvent thereto to adjust the viscosity as desired, or a method of previously diluting component (A), (B) and/or (C) having a high viscosity with a solvent to improve the efficiency of working or mixing, and mixing the remaining components therewith. In the practice of the mixing step for forming the solution, a suitable mixing technique may be selected from a shaking mixer, magnetic stirrer, and various other mixers, depending on the viscosity and working efficiency of the composition.

The amount of the solvent added is determined as appropriate from the aspect of adjusting the viscosity and working efficiency of the composition and the film thickness of a temporary adhesive layer. For example, the amount of the solvent is preferably 5 to 900 parts by weight, more preferably 10 to 400 parts by weight per 100 parts by weight of the photocurable silicone resin composition.

The photocurable silicone resin composition may be applied to a substrate by a suitable technique such as spin coating or roll coating to form a temporary adhesive layer. When the temporary adhesive layer is formed on the substrate by spin coating, preferably the photocurable silicone resin composition is converted into a solution form before coating.

The solution of the photocurable silicone resin composition should preferably have a viscosity at 25° C. of 1 to 100,000 mPa·s, more preferably 10 to 10,000 mPa·s from the aspect of coating efficiency.

The photocurable silicone resin composition shows a 180° peeling force of typically from 2 gf to 50 gf, preferably from 3 gf to 30 gf, more preferably from 5 gf to 20 gf when tested by curing the resin composition, and peeling back a specimen of 25 mm wide (e.g., silicon substrate specimen) from the cured layer at 180° and 25° C. A peeling force of at least 2 gf is sufficient to prevent the wafer from being shifted during wafer grinding whereas a peeling force of up to 50 gf allows for smooth release of the wafer.

After curing, the photocurable silicone resin composition should preferably have a storage elastic modulus at 25° C. of from 1,000 Pa to 1,000 MPa, more preferably from 10,000 Pa to 500 MPa. A storage elastic modulus of at least 1,000 Pa indicates that the resulting film is tough enough to prevent the wafer from being shifted and concomitantly cracked during wafer grinding whereas a storage elastic modulus of up to 1,000 MPa indicates that the deforming stress during wafer thermal processing such as CVD is mitigated and the composition is stable during wafer thermal processing.

Thin Wafer Manufacturing Method

The invention also provides a method for manufacturing a thin wafer, characterized in that the temporary adhesive layer composed of the photocurable silicone resin composition is used as a temporary bond layer between a wafer bearing a semiconductor circuit or the like and a support. Two embodiments of the method are illustrated in FIG. 1. In either of the embodiments, the thin wafer resulting from the manufacturing method typically has a thickness of 5 to 300 μm, more typically 10 to 100 μm.

In the first embodiment, the method for manufacturing a thin wafer involves the following steps (a1) to (e) and optionally steps (f) to (i).

Step (a1)

Starting with a wafer having a circuit-forming surface on a front side and a non-circuit-forming surface on a back side, step (a) is a temporary bonding step of releasably bonding the circuit-forming surface of the wafer to a support with the wafer processing temporary adhesive to construct a wafer laminate.

Specifically, any of the following methods is applied: a method including forming a temporary adhesive layer on the front surface of the wafer from the wafer processing temporary adhesive and attaching the front surface of the wafer to the support through the temporary adhesive layer; a method including forming a temporary adhesive layer on the surface of the support from the wafer processing temporary adhesive and attaching the support to the front surface of the wafer through the temporary adhesive layer; and a method including forming a temporary adhesive layer on both the front surface of the wafer and the surface of the support from the wafer processing temporary adhesive and attaching the support to the front surface of the wafer through the temporary adhesive layers.

The wafer which can be used herein is typically a semiconductor wafer. Suitable semiconductor wafers include silicon wafers, germanium wafers, gallium-arsenic wafers, gallium-phosphorus wafers, and gallium-arsenic-aluminum wafers. Although the thickness of the wafer is not particularly limited, it is typically 600 to 800 μm, more typically 625 to 775 μm.

In the first embodiment wherein light is irradiated to the photocurable silicone resin composition through the support, the support which can be used herein are light-transmissive substrates such as glass plates, quartz plates, acrylic plates, polycarbonate plates, and polyethylene terephthalate plates. Inter alia, glass plates are preferred because they are transmissive to UV radiation and fully heat resistant.

The temporary adhesive layer may be formed by shaping the photocurable silicone resin composition into a film and laying the film on the wafer or support, or by applying the photocurable silicone resin composition by such a technique as spin coating or roll coating. When the photocurable silicone resin composition takes a solution form containing a solvent, the solution is coated and prebaked under suitable conditions for the volatility of the solvent, preferably at a temperature of 20 to 200° C., more preferably 30 to 150° C., prior to use.

The temporary adhesive layer is preferably formed to a film thickness of 0.1 to 500 μm, more preferably 1.0 to 200 μm prior to use. A film thickness of at least 0.1 μm ensures that the solution is coated all over a substrate without leaving uncoated spots. On the other hand, a film thickness of up to 500 μm ensures that the layer withstands the grinding step in the thin wafer formation.

The method of bonding the front surface of the wafer to the support via the temporary adhesive layer is, for example, by uniformly compression bonding under a reduced pressure at a temperature in the range of preferably 0 to 200° C., more preferably 20 to 100° C.

The pressure applied when the wafer having the temporary adhesive layer formed thereon and the support are compression bonded is preferably 0.01 to 10 MPa, more preferably 0.05 to 1.0 MPa, although the pressure varies with the viscosity of the temporary adhesive layer. As long as the pressure is at least 0.01 MPa, the circuit-forming surface is covered or the wafer/support interface is filled with the temporary adhesive layer. A pressure of up to 10 MPa avoids the risk of wafer cracking and aggravation of the flatness of the wafer and the temporary adhesive layer, ensuring subsequent effective wafer processing.

Bonding of the wafer may be performed using commercially available wafer bonders such as EVG520IS and 850TB from EV Group, and XBC300 from SUSS MicroTec AG.

Step (b1)

Step (b1) is to photo-cure the temporary adhesive layer. After the wafer laminate (or laminated substrate) is constructed, light irradiation is performed from the side of the light-transmissive support to photo-cure the temporary adhesive layer. Although the actinic light species used herein is not particularly limited, it is preferably UV radiation, especially UV radiation of wavelength 300 to 400 nm. In view of satisfactory cure, the dose of UV radiation (or illuminance) is desirably 100 to 100,000 mJ/cm$^2$, preferably 500 to 10,000 mJ/cm$^2$, more preferably 1,000 to 5,000 mJ/cm$^2$, calculated as integral light quantity. As long as the dose of UV radiation (or illuminance) is above the lower limit, a sufficient amount of energy to activate the photo-activatable hydrosilylation catalyst in the temporary adhesive layer is available, yielding a satisfactory cured product. As long as the close of UV radiation (or illuminance) is below the upper limit, a sufficient amount of energy is irradiated to the composition and a satisfactory cured product is obtained without the risks of decomposition of components in the polymer layer and deactivation of some catalyst.

The UV radiation to be irradiated may be either light having a plurality of emission spectra or light of a single emission spectrum. The light of a single emission spectrum may have a broad spectral region of 300 to 400 nm. The light of a single emission spectrum is typically light having a peak (i.e., maximum peak wavelength) in the range of 300 to 400 nm, preferably 350 to 380 nm. Examples of the light source of emitting such light include UV-emitting semiconductor device light sources such as UV-emitting diodes (UV-LEDs) and UV-emitting semiconductor lasers.

Examples of the light source of emitting light having a plurality of emission spectra include lamps such as metal halide lamps, xenon lamps, carbon arc lamps, chemical lamps, sodium lamps, low-pressure mercury lamps, high-pressure mercury lamps, ultra-high-pressure mercury lamps, gas lasers of nitrogen or the like, liquid lasers of organic dye solution, and solid lasers of inorganic single crystals doped with rare earth ions.

When the light has such emission spectrum that a peak appears in a wavelength region shorten than 300 nm, or a wavelength having an irradiance which is greater than 5% of the irradiance of the maximum peak wavelength in the emission spectrum is included in a wavelength region shorter than 300 nm (for example, the emission spectrum is broad over a wide wavelength region), and when a substrate having light transmittance relative to wavelength shorter than 300 nm, typically quartz wafer is used as the support, it is preferred for obtaining a satisfactory cured product that light of wavelength in the wavelength region shorter than 300 nm is removed by an optical filter. As a result, the irradiance of each wavelength in the wavelength region shorter than 300 nm is up to 5%, preferably up to 1%, more preferably up to 0.1%, most preferably 0% of the irradiance of the maximum peak wavelength. Notably, where the emission spectrum includes a plurality of peaks in the wavelength region of 300 to 400 nm, the peak wavelength corresponding to the maximum absorbance is the maximum peak wavelength. The optical filter is not particularly limited as long as light of wavelength shorter than 300 nm is cut off. Any of well-known filters may be used, for example, 365-nm bandpass filter. It is noted that the irradiance and spectral distribution of UV light can be measured by a spectral radiometer, for example, USR-45D (Ushio, Inc.).

The light irradiation equipment may be selected from such irradiation units as spot, area, line, and conveyor irradiation units, though not particularly limited.

When the photocurable silicone resin composition is cured, the light irradiation time which cannot be determined to a certain range because it is dependent on the irradiance, is, for example, 1 to 300 seconds, preferably 10 to 200 seconds, more preferably 30 to 150 seconds for thereby adjusting the irradiance. The irradiation time in the range is properly short and raises no problems in the working process. The photocurable silicone resin composition as light irradiated gels after 1 to 120 minutes, especially 5 to 60 minutes from irradiation. As used herein, the "gelation"

means that the photocurable silicone resin composition loses flow as the cluing reaction takes place to some extent.

Step (c)

Step (c) is the step of grinding or polishing the non-circuit-forming surface of the wafer temporarily bonded to the support. That is, step (c) is to reduce the thickness of the wafer by grinding or polishing the wafer back surface of the wafer laminate resulting from the previous step. The technique of grinding the wafer back surface is not particularly limited, and any well-known grinding techniques may be used. The wafer is ground by a grinding wheel (e.g., diamond grinding wheel), preferably while feeding water to the wafer and the wheel for cooling. The machine for grinding the wafer back surface is, for example, a surface grinder DAG-810 (trade name) by DISCO Co., Ltd. The wafer back surface may also be subjected to chemical mechanical polishing (CMP).

Step (d)

Step (d) is to process the non-circuit-forming surface of the wafer laminate which has been ground, i.e., the non-circuit-forming surface of the wafer in the wafer laminate which has been thinned by back surface grinding step (c). This step includes various processes which can be applied on the wafer level, for example, electrode formation, metal conductor formation, and protective film formation. More specifically, any conventional well-known processes may be applied, including metal sputtering for forming electrodes or the like, wet etching of a sputtered metal layer, formation of a pattern (serving as a mask for metal conductor formation) by resist coating, exposure and development, removal of resist, dry etching, metallization, silicon etching for TSV formation, and oxide film formation on silicon surface.

Step (e)

Step (e) is to release the wafer which has been processed in step (d) from the support, that is, to peel the thin wafer from the support after variously processing the thinned wafer in step (d) and before dicing. This release procedure is typically performed under relatively moderate conditions including a temperature from room temperature to about 60° C. Suitable release procedures for separating the wafer from the support include, but are not limited to, a pull-up procedure of holding the wafer or support of the wafer laminate horizontally, and pulling up the support or wafer at an angle relative to the horizon, a procedure of previously immersing the wafer laminate in a solvent to swell the temporary adhesive layer and peeling or releasing as above, and a peeling procedure of adhering a protective film to the ground surface of the wafer and peeling the protective film together with the wafer from the wafer laminate. In the release step, any of these peeling procedures is performed typically at room temperature.

Preferably step (e) of releasing the processed wafer from the support includes the steps of
(e1) attaching a dicing tape to the processed surface of the wafer,
(e2) vacuum chucking the dicing tape to a chuck platen, and
(e3) separating the support from the processed wafer in a peel-off manner while keeping the temperature of the chuck platen in a range of 10 to 100° C.

In this way, the support may be readily separated from the processed wafer, and the subsequent dicing step may be readily performed.

Preferably step (e) of releasing the processed wafer from the support is followed by step of
(f) removing any temporary adhesive layer remaining on the circuit-forming surface of the wafer.

Sometimes part of the temporary adhesive layer is left on the circuit-forming surface of the wafer which has been released from the support in step (e). The temporary adhesive layer may be removed, for example, by washing the wafer.

Step (f) may use any cleaning fluid which is capable of dissolving the silicone resin of the temporary adhesive layer. Suitable solvents include pentane, hexane, cyclohexane, decane, isononane, p-menthane, pinene, isododecane, and limonene, which may be used alone or in admixture of two or more.

If removal of the temporary adhesive layer is difficult, a base or acid may be added to the cleaning fluid. Suitable bases used herein include amines such as ethanolamine, diethanolamine, triethanolamine, triethylamine and ammonia, and ammonium salts such as tetramethylainnionium hydroxide. Suitable acids used herein include organic acids such as acetic acid, oxalic acid, benzenesulfonic acid, and dodecylbenzenesulfonic acid. The base or acid is typically added to the cleaning fluid in a concentration of preferably 0.01 to 10% by weight, more preferably 0.1 to 5% by weight. For more efficient removal of residues, any known surfactants may be added to the cleaning fluid. As the wafer cleaning agent, commercially available cleaners of SPIS-TA-CLEANER series (Shin-Etsu Chemical Co., Ltd.) may be advantageously used.

The wafer washing step may be carried out by agitating the cleaning fluid with a puddle, spraying the cleaning fluid, or immersing in a cleaning fluid bath. The temperature of the washing step is preferably 10 to 80° C., more preferably 15 to 65° C. If necessary, the dissolution of the temporary adhesive layer in the cleaning fluid may be followed by rinsing with water or alcohol and final drying.

In the second embodiment, the method for manufacturing a thin wafer involves the following steps (a2) and (b2). Steps following (b2), that is, steps (c) to (e), preferably steps (c) to (f) are the same as in the first embodiment.

Step (a2)

Step (a2) is to form a layer of the photocurable silicone resin composition as light irradiated on the wafer and/or support.

Unlike the first embodiment wherein light irradiation is performed after bonding of the wafer to the support, the step of light irradiation to the photocurable silicone resin composition prior to bonding eliminates the step of light irradiation through the support and as a consequence, the support need not be light transmissive. Therefore, in the second embodiment, in addition to the above-mentioned examples of the support, substrates which are non-transmissive to light such as silicon, aluminum, SUS, copper, germanium, gallium-arsenic, gallium-phosphorus, and gallium-arsenic-aluminum are applicable as the support. Also the second embodiment broadens the range of acceptable wafer because the cure-inhibitory influence from the wafer can be mitigated.

In the context of coating the photocurable silicone resin composition as light irradiated, the composition may be coated to (1) wafer, (2) support, and (3) both wafer and support, prior to use.

Examples of the method of irradiating light to the photocurable silicone resin composition prior to bonding includes a method of coating the composition to the wafer and of support while irradiating light thereto, a method of irradiating light to the overall composition and then coating the composition onto the wafer and/or support, and a method of coating the composition onto the wafer and/or support and then irradiating light thereto. Without a particular limit, any of these methods is selected in view of working efficiency. For the actinic light species, UV irradiation dose (irradiance), light source, emission spectrum, light irradiation equipment, and light irradiation tune in the light irradiation step, reference is made to the description for step (b1) in the first embodiment.

The method of forming the first and second temporary adhesive layers is the same as in the first embodiment, and includes attaching a film of the composition or applying the composition or solution thereof to the wafer and/or support by such a coating technique as spin coating or roll coating to form the adhesive layers. When a solution of the composition is used, it is spin coated and then prebaked at a temperature of 20 to 200° C., preferably 30 to to 150° C., depending on the volatilizing conditions of the solvent, prior to use.

Step (b2)

Step (b2) is to bond the circuit-bearing wafer and/or support having the photocurable silicone resin composition layer formed thereon resulting from step (a2) in vacuum. By uniformly compression bonding the substrate under a reduced pressure (or vacuum) at a temperature in the range of preferably 0 to 200° C., more preferably 20 to 100° C., a wafer laminate (or laminated substrate) in which the wafer is bonded to the support is constructed. The wafer bonder used herein is the same as used in the first embodiment.

EXAMPLES

Preparation Examples, Comparative Preparation Examples, Examples, and Comparative Examples are given below for illustrating the invention although the invention is not limited thereto, Notably, the viscosity is measured at 25° C. by a rotational viscometer TVB-10M type (Toki Sangyo Co., Ltd.).

[1]PREPARATION OF PHOTOCURABLE SILICONE RESIN SOLUTION

Preparation Example 1

A solution of 100 parts by weight of dimethylpolysiloxane containing 2.5 mol % of vinyl groups on molecular side chains and having a Mn of 30,000 in 200 parts by weight of toluene was combined and mixed with a solution of 50 parts by weight of vinylmethylpolysiloxane composed of 50 mol % of $SiO_{4/2}$ units (Q units), 48 mol % of $(CH_3)_3SiO_{1/2}$ units (M units), and 2 mol % of $(CH_2=CH)_3SiO_{1/2}$ units (Vi units) and having a Mn of 7,000 in 100 parts by weight of toluene, 230 parts by weight of an organohydrogenpolysiloxane represented by the formula (M-1) shown below and having a Mn of 2,800, a solution of 50 parts by weight of dimethylpolysiloxane capped with trimethylsiloxy groups at both ends of the molecular chain and having a 30 wt % toluene solution viscosity at 25° C. of 30,000 mPa·s in 120 parts by weight of toluene, and 0.6 part by weight of 1-ethynylcyclohexanol. Further, 0.4 part by weight of a photo-activatable hydrosilylation reaction catalyst, i.e., toluene solution (Pt concentration 1.0 wt %) of (methylcyclopentadienyl)trimethyl platinum(IV) was added to the solution, which was passed through a membrane filter of 0.2 μm, obtaining a photocurable silicone resin solution A1. The resin solution A1 had a viscosity at 25° C. of 230 mPa·s.

[Chem. 2]

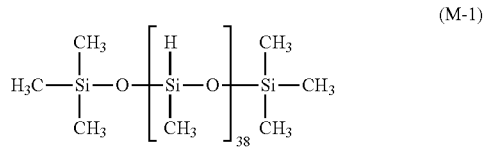

(M-1)

Preparation Example 2

A solution of 70 parts by weight of dimethylpolysiloxane containing 2.5 mol % of vinyl groups on molecular side chains and having a Mn of 30,000 and 30 parts by weight of dimethylpolysiloxane containing 0.15 mol % of vinyl groups at both ends of the molecular chain and having a Mn of 60,000in 200 parts by weight of toluene was combined and mixed with a solution of 50 parts by weight of vinylmethylpolysiloxane composed of 50 mol % of $SiO_{4/2}$ units (Q units), 48 mol % of $(CH_3)_3SiO_{1/2}$ units (M units), and 2 mol % of $(CH_2=CH)_3SiO_{1/2}$ units (Vi units) and having a Mn of 7,000 in 100 parts by weight of toluene, 180 parts by weight of organohydrogenpolysiloxane represented by formula (M-1) and having a Mn of 2,800, 30 parts by weight of dimethylpolysiloxane capped with trimethylsiloxy groups at both ends of the molecular chain and having a 30 wt % toluene solution viscosity at 25° C. of 1,000 mPa·s, and 0.6 part by weight of 1-ethynylcyclohexanol. Further, 0.4 part by weight of a photo-activatable hydrosilylation reaction catalyst, i.e., toluene solution (Pt concentration 1.0 wt % of (methylcyclopentadienyl)trimethyl platinum(IV) was added to the solution, which was passed through a membrane filter of 0.2 μm, obtaining a photocurable silicone resin solution A2. The resin solution A2 had a viscosity at 25° C. of 100 mPa·s.

Preparation Example 3

A solution of 100 parts by weight of dimethylpolysiloxane containing 2.5 mol % of vinyl groups on both ends and side chains of the molecular chain and having a Mn of 30,000 in 200 parts by weight of toluene was combined and mixed with a solution of 50 parts by weight of vinylmethylpolysiloxane composed of 50 mol % of $SiO_{4/2}$ units (Q units), to 48 mol % of $(CH_3)_3SiO_{1/2}$ units (M units), and 2 mol % of $(CH_2=CH)_3SiO_{1/2}$ units (Vi units) and having a Mn of 7,000 in 100 parts by weight of toluene, 230 parts by weight of organohydrogenpolysiloxane represented by formula (M-1) and having a Mn of 2,800, a solution of 20 parts by weight of dimethylpolysiloxane capped with trimethylsiloxy groups at both ends of the molecular chain and having a 30 wt % toluene solution viscosity at 25° C. of 100,000 mPa·s in 300 parts by weight of toluene, and 0.6 part by weight of 1-ethynylcyclohexanol. Further, 0.4 part by weight of a photo-activatable hydrosilylation reaction catalyst, i.e., toluene solution (Pt concentration 1.0 wt. %) of (methylcyclopentadienyl)trimethyl platinum(IV) was added to the solution, which was passed through a membrane filter of 0.2 μm, obtaining a photocurable silicone resin solution A3. The resin solution A3 had a viscosity at 25° C. of 330 mPa·s.

Preparation Example 4

A solution of 100 parts by weight of dimethylpolysiloxane containing 2.5 mol % of vinyl goups on both ends and side chains of the molecular chain and having a Mn of 30,000 in 200 parts by weight of toluene was combined and mixed with a solution of 200 parts by weight of vinylmethylpolysiloxane composed of 50 mol % of $SiO_{4/2}$ units (Q units), 48 mol % of $(CH_3)_3SiO_{1/2}$ units (M units), and 2 mol % of $(CH_2=CH)_3SiO_{1/2}$ units (Vi units) and having a Mn of 7,000 in 400 parts by weight of toluene, 430 parts by weight of organohydrogenpolysiloxane represented by formula (M-1) and having a Mn of 2,800, a solution of 100 parts by weight of dimethylpolysiloxane capped with trimethylsiloxy groups at both ends of the molecular chain and having a 30 wt % toluene solution viscosity at 25° C. of 30,000 mPa·s in 120 parts by weight of toluene, and 1.2 parts by weight of 1-ethynylcyclohexanol. Further, 0.8 part by weight of a photo-activatable hydrosilylation reaction catalyst, i.e., toluene solution (Pt concentration 1.0 wt %) of (methylcyclopentadienyl)trimethyl platinum(IV) was added to the solution, which was passed through a membrane filter of 0.2 μm, obtaining photocurable silicone resin solution A4. The resin solution A4 had a viscosity at 25° C. of 120 mPa·s.

Preparation Example 5

A solution of 70 parts by weight of dimethylpolysiloxane containing 2.5 mol % of vinyl groups on molecular side chains and having a Mn of 30,000 and 30 parts by weight of dimethylpolysiloxane containing 0.15 mol % of vinyl groups at both ends of the molecular chain and having a Mn of 60,000 in 200 parts by weight of toluene was combined and mixed with a solution of 200 parts by weight of vinylmethylpolysiloxane composed of 50 mol % of $SiO_{4/2}$ units (Q units), 48 mol % of $(CH_3)_3SiO_{1/2}$ units (M units), and 2 mol % of $(CH_2=CH)_3SiO_{1/2}$ units (Vi units) and having a Mn of 7,000 in 400 parts by weight of toluene, 380 parts by weight of organohydrogenpolysiloxane represented by formula (M-1) and having a Mn of 2,800, 150 parts by weight of dimethylpolysiloxane capped with trimethylsiloxy groups at both ends of the molecular chain and having a 30 wt. % toluene solution viscosity at 25° C. of 1,000 mPa·s, and 1.2 parts by weight of 1-ethynylcyclohexanol. Further, 0.8 part by weight of a photo-activatable hydrosilylation reaction catalyst, i.e., toluene solution (Pt concentration 1.0 wt %) of (methylcyclopentadienyl)trimethyl platinum(IV) was added to the solution, which was passed through a membrane filter of 0.2 μm, obtaining a photocurable silicone resin solution A5. The resin solution A5 had a viscosity at 25° C. of 80 mPa·s.

Preparation Example 6

A solution of 100 parts by weight of dimethylpolysiloxane containing 2.5 mol % of vinyl groups on both ends and side chains of the molecule and having a Mn of 30,000 in 200 parts by weight of toluene was combined and mixed with a solution of 50 parts by weight of vinylmethylpolysiloxane composed of 50 mol % of $SiO_{4/2}$ units (Q units), 48 mol % of $(CH_3)_3SiO_{1/2}$ units (M units), and 2 mol % of $(CH_2=CH)_3SiO_{1/2}$ units (Vi units) and having a Mn of 7,000 in 100 parts by weight of toluene, 230 parts by weight of organohydrogenpolysiloxane represented by formula (M-1) and having as Mn of 2,800, a solution of 50 parts by weight of dimethylpolysiloxane capped with trimethylsiloxy groups at both ends of the molecular chain and having a 30 wt % toluene solution viscosity 25'C of 30,000 mPa·s in 120 parts by weight of toluene, and 0.6 part by weight of 1-ethynylcyclohexanol. Further, 0.8 part by weight of a photo-activatable hydrosilylation reaction catalyst, i.e., 2-(2-butoxyethoxy)ethyl acetate solution (Pt concentration 0.5 wt %) of bis(2,4-heptanedionato) platinum (II) was added to the solution, which was passed through a membrane filter of 0.2 μm, obtaining a photocurable silicone resin solution A6. The resin solution A6 had a viscosity at 25° C. of 230 mPa·s.

Preparation Example 7

A solution of 70 parts by weight of dimethylpolysiloxane containing 2.5 mol % of vinyl groups on molecular side chains and having a Mn of 30,000 and 30 parts by weight of dimethylpolysiloxane containing 0.15 mol % of vinyl groups at both ends of the molecular chain and having a Mn of 60,000 in 200 parts by weight of toluene was combined and mixed with a solution of 200 parts by weight of vinylmethylpolysiloxane composed of 50 mol % of $SiO_{4/2}$ units (Q units), 48 mol % of $(CH_3)_3SiO_{1/2}$ units (M units), and 2 mol % of $(CH_2=CH)_3SiO_{1/2}$ units (Vi units) and having a Mn of 7,000 in 400 parts by weight of toluene, 380 parts by weight of organohydrogenpolysiloxane represented by formula (M1) and having a Mn of 2,800, 150 parts by weight of dimethylpolysiloxane capped with trimethylsiloxy groups at both ends of the molecular chain and having a 30 wt % toluene solution viscosity at 25° C. of 1,000 mPa·s, and 1.2 parts by weight of 1-ethynylcyclohexanol. Further, 1.6 parts by weight of a photo-activatable hydrosilylation reaction catalyst, i.e., 2-(2-butoxyethoxy)ethyl acetate solution (Pt concentration 0.5 wt %) of bis(2,4-heptanedionato)platinum(II) was added to the solution, which was passed through a membrane filter of 0.2 μm, obtaining a photocurable silicone resin solution A7. The resin solution A7 had a viscosity at 25° C. of 80 mPa·s.

Comparative Preparation Example 1

A thermosetting silicone resin solution CA1 was prepared by the same procedure as in Preparation Example 1 except that 0.4 part by weight of photo-activatable hydrosilylation reaction catalyst, i.e., toluene solution (Pt concentration 1.0 wt %) of (methylcyclopentadienyl)trimethyl platinum(IV) was replaced by 0.4 part by weight of heat-activatable hydrosilylation reaction catalyst CAT-PL-5 (Shin-Etsu Chemical Co., Ltd., Pt concentration 1.0 wt %). The resin solution CA1 had a viscosity at 25'C of 230 mPa·s.

Comparative Preparation Example 2

A photocurable silicone resin solution CA2 was prepared by the same procedure as in Preparation Example 1 except that the solution of 50 parts by weight of dimethylpolysiloxane capped with trimethylsiloxy groups at both ends of the molecular chain in 120 parts by weight of toluene was omitted. The resin solution CA2 had a viscosity at 25° C. of 150 mPa·s.

Comparative Preparation Example 3

A photocurable silicone resin solution CA3 was prepared by the same procedure as in Preparation Example 2 except that 30 parts by weight of dimethylpolysiloxane capped with trimethylsiloxy groups at both ends of the molecular chain was omitted. The resin solution CA3 had a viscosity at 25° C. of 180 mPa·s.

Comparative Preparation Example 4

A photocurable silicone resin solution CA4 was prepared by the same procedure as in Preparation Example 1 except that 50 parts by weight of the dimethylpolysiloxane capped with trimethylsiloxy groups at both ends of the molecular chain was replaced by 50 parts by weight of polysiloxane containing epoxy groups on side chains, represented by the formula (M-2) shown below, and having a 30 wt % toluene solution viscosity at 25° C. of 33,000 mPa·s. The resin solution CA4 had a viscosity at 25° C. of 260 mPa·s.

[Chem. 3]

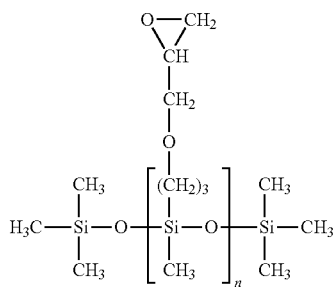

(M-2)

Comparative Preparation Example 5

A photocurable silicone resin solution CA5 was prepared by the same procedure as in Preparation Example 2 except that 30 parts by weight of the dimethylpolysiloxane capped with trimethylsiloxy groups at both ends of the molecular chain was replaced by 30 parts by weight of polysiloxane containing trimethoxysilyl groups on side chains, represented by the formula (M-3) shown below, and having a 30 wt % toluene solution viscosity at 25° C. of 2,500 mPa·s. The resin solution CA4 had a viscosity at 25° C. of 190 mPa·s.

[Chem. 4]

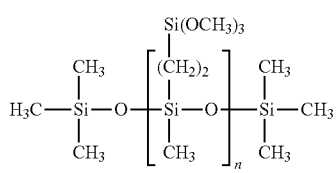

(M-3)

[2] Preparation and Evaluation of Wafer Laminate

Examples 1 to 7 and Comparative Examples 1 to 5

Each of curable silicone resin solutions A1 to A7 and CA1 to CA5 was spin coated onto a silicon wafer of diameter 200 mm and thickness 725 μm having copper posts (diameter 40 μm, height 10 μm) distributed over its entire surface, and baked on a hot plate at 100° C. for 2 minutes to form a temporary adhesive layer having a thickness shown in Table 1 on the bump-bearing surface of the wafer. A glass disk of diameter 200 mm and thickness 500 μm was used as the support. Using a wafer bonder EVG520IS (by EV Group), the silicon wafer hearing the temporary adhesive layer and the glass disk were vacuum joined at 25° C., below $10^{-3}$ mbar and load 5 kN so that the temporary adhesive layer mated with the glass disk. Thereafter, using an area-irradiation type UV-LED (wavelength 365 nm) irradiation unit, the curable silicone resin composition layer was irradiated with UV under the conditions shown in Table 1, completing a wafer laminate. For the sample using thermosetting silicone resin solution CA1, a wafer laminate was constructed by heating on a hot plate under the conditions shown in Table 1.

Thereafter, the wafer laminate was examined by the following tests, with the results shown in Table 1. The tests were carried out by the following procedures.

(1) Wafer Warpage Test

In the preparation of wafer laminates, the warpage Of a wafer in the step of curing a temporary adhesive layer was confirmed by visual observation. The sample was evaluated good (O) when no warpage occurred and poor (X) when warpage occurred.

(2) Bonding Test

The wafer laminate was heated in an oven at 180° C. for 1 hour and cooled to room temperature, after which the bond at the wafer interface was visually observed. The sample was evaluated good (O) when no defects like bubbles were found at the interface and poor (X) when defects were found.

(3) Back Surface Grinding Resistance Test

The back surface of the silicon wafer of the wafer laminate was ground by a grinder DAG-810 (DISCO Co., Ltd.) having a diamond abrasive wheel. After the substrate was ground to a thickness of 50 μm, it was observed for defects such as cracks and peels under an optical microscope (100×). The sample was evaluated good (O) when no defects were found, and poor (X) when defects were found.

(4) CVD Resistance Test

After the hack surface grinding resistance test (3), the wafer laminate was placed in a CVD apparatus where a $SiO_2$ film was deposited to a thickness of 2 μm. The outer appearance of the laminate was visually observed for anomalies. The sample was evaluated good (O) when no appearance anomalies were found, and poor (X) when appearance anomalies such as voids, wafer bulging and wafer rupture were found. The conditions of CVD resistance test are as follows.

Apparatus: Plasma CVD PD-270STL (SAMCO, Inc.)
RF 500W, Inner pressure 40 Pa,
TEOS (tetraethyl orthosilicate): $O_2$=20:680 sccm (5) Peel Test The substrate peeling was evaluated. After the CVD resistance test (4), a dicing tape ELP UB-3083D (Nitto Denko Corp.) was applied to the wafer side of the wafer laminate, using a dicing frame. The dicing tape was set to the chuck platen by vacuum chucking. At room temperature, the glass substrate was peeled by pulling it up at one point using a pair of tweezers. The sample was evaluated good (O) when the glass substrate was peeled without breakage of the 50-μm thick wafer, and poor (X) when cracks or other anomalies were found.

(6) Clean-Away Test

After the peel test (5), the wafer of diameter 200 mm (which had been exposed to the CVD resistance test conditions) mounted on the dicing frame via the dicing tape was set on a spin coater, with the peeled surface upside. Over the wafer, a cleaning fluid SPIS-TA-CLEANER 25 (Shin-Etsu Chemical Co., Ltd.) was sprayed for 5 minutes. Rinsing was then performed by spraying isopropyl alcohol (IPA) while spinning the wafer. The outer appearance of the wafer was visually observed for any adhesive residues. The sample was evaluated good (O) when no resin residues were found and poor (X) when resin residues were found.

(7) Peeling (Release) Force Test

Each of silicone resin solutions A1 to A7 and CA1 to CA5 was spin coated onto a silicon wafer of diameter 200 mm and thickness 725 μm and baked on a hot plate at 100° C. for 2 minutes to form a silicone resin layer having a thickness shown in Table 1. Then, using an area-irradiation type UV-LED (wavelength 365 nm) irradiation unit, the curable silicone resin composition layer was irradiated with UV under the conditions shown in Table 1 and cured into a temporary adhesive layer. For the sample using thermosetting silicone resin solution CA1, a temporary adhesive layer was cured by heating on a hot plate under the conditions shown in Table 1.

Thereafter, five strips of polyimide tape of 150 mm long and 25 mm wide were attached to the silicone resin layer on the wafer, after which those portions of the temporary adhesive layer which were not covered with the tape were removed. Using AUTOGRAPH AG-1 (Shimadzu Corp.), the tape strip was peeled back at 25° C., an angle of 180° and a rate of 300 mm/min over a stroke of 120 mm from its one end. An average, of forces required to peel (120 mm stroke, 5 strips) was computed and reported as peeling (release) force of the silicone resin layer.

(8) Measurement of Storage Elastic Modulus

Each of curable silicone resin solutions A1 to A7 and CA1 to CA5 was spin coated onto a silicon substrate and baked on a hot plate at 100° C. for 2 minutes to form a silicone resin layer having a thickness shown in Table 1 on the silicon substrate. Then, using an area-irradiation type UV-LED (wavelength 365 nm) irradiation unit, the curable silicone resin composition layer was irradiated with UV under the conditions shown in Table 1 and cured into a temporary adhesive layer. For the sample using thermosetting silicone resin solution CA1, a temporary adhesive layer was cured by heating on a hot plate under the conditions shown in Table 1.

The silicon substrate bearing the temporary adhesive layer was sandwiched between aluminum plates of 25 mm such that a load of 50 gf was applied to the temporary adhesive layer. Using a rheometer ARES-G2 (TA Instruments), an elastic modulus was measured at 25° C. and 1 Hz. The measured value is regarded as the storage elastic modulus of the silicone resin layer.

TABLE 1

| | | Example | | | | | | |
|---|---|---|---|---|---|---|---|---|
| | | 1 | 2 | 3 | 4 | 5 | 6 | 7 |
| Substrate | | circuit-bearing Si wafer | | | | | | |
| Support | | glass | | | | | | |
| Silicone resin solution | | A1 | A2 | A3 | A4 | A5 | A6 | A7 |
| Thickness of temporary adhesive layer (μm) | | 60 | 55 | 62 | 59 | 57 | 61 | 58 |
| Curing conditions of temporary adhesive layer | | 100 mW/cm$^2$ × 60 sec. = 6,000 mJ/cm$^2$ (23° C.) | | | | | | |
| Wafer warpage | | O | O | O | O | O | O | O |
| Bond | | O | O | O | O | O | O | O |
| Back surface grinding resistance | | O | O | O | O | O | O | O |
| CVD resistance | | O | O | O | O | O | O | O |
| Peeling | | O | O | O | O | O | O | O |
| Clean-away | | O | O | O | O | O | O | O |
| Peeling force of silicone resin layer | Substrate | Si wafer | | | | | | |
| | Peeling force (gf) | 23 | 31 | 15 | 14 | 12 | 25 | 16 |
| Storage elastic modulus of silicone resin layer | Substrate | Si wafer | | | | | | |
| | Elastic modulus (×10$^5$ Pa) | 0.31 | 0.10 | 0.40 | 2.10 | 1.30 | 0.28 | 1.10 |

TABLE 2

| | Comparative Example | | | | | |
|---|---|---|---|---|---|---|
| | 1 | 2 | 3 | 4 | 5 | 6 |
| Substrate | circuit-bearing Si wafer | | | | | |
| Support | glass | | | | | |
| Silicone resin solution | CA1 | CA1 | CA2 | CA3 | CA4 | CA5 |
| Thickness of temporary adhesive layer (μm) | 60 | 59 | 57 | 58 | 61 | 59 |
| Curing conditions of temporary adhesive layer | 150° C. × 10 min. | 100 mW/cm$^2$ × 60 sec. = 6,000 mJ/cm$^2$ (23° C.) | | | | |
| Wafer warpage | x | O | O | O | O | O |
| Bond | O | x | O | O | O | O |
| Back surface grinding resistance | — | — | O | O | O | O |
| CVD resistance | — | — | O | O | O | O |
| Peeling | — | — | x not peelable | x not peelable | x not peelable | x not peelable |

TABLE 2-continued

|  |  | Comparative Example | | | | | |
|---|---|---|---|---|---|---|---|
|  |  | 1 | 2 | 3 | 4 | 5 | 6 |
| Clean-away |  | — | — | — | — | — | — |
| Peeling force of silicone resin layer | Substrate | | | Si wafer | | | |
|  | Peeling force (gf) | uncured | uncured | 63 | 55 | 79 | 86 |
| Storage elastic modulus of silicone resin layer | Substrate | | | Si wafer | | | |
|  | Elastic modulus (×10$^5$ Pa) | 0.008 | 0.001 | 0.51 | 0.28 | 0.29 | 0.22 |

As shown in Table 1, the wafer laminates of Examples 1 to 7 including the temporary adhesive layer within the scope of the invention are capable of curing at relatively low temperature within a short time and accordingly reduced in wafer warpage upon curing. They have sufficient processing durability, good peeling properties, and good clean-away after peeling. In contrast, as shown in Table 2, the wafer laminates of Comparative Examples 1 and 2 using a heat-activatable catalyst showed under-cure due to short heating and wafer warpage upon curing. Comparative Examples 3 and 4 free of the non-functional organopolysiloxane and Comparative Examples 5 and 6 containing the functional organopolysiloxane showed a strong bond between the circuit-bearing wafer and the support. As a result, the wafer cracked in the peeling step and peeling was impossible.

Example 8

The photocurable silicone resin solution A1 was irradiated with UV on an area-irradiation type UV-LED (wavelength 365 nm) irradiation unit, under the conditions shown in Table 2, then spin coated onto a silicon wafer of diameter 200 nm and thickness 725 μm having copper posts (diameter 40 μm, height 10 μm) distributed over its entire surface (i.e., circuit-bearing Si wafer), and baked on a hot plate at 100° C. for 2 minutes to form a temporary adhesive layer having a thickness shown in Table 2 on the bump-bearing surface of the wafer. A silicon wafer of diameter 200 mm and thickness 770 μm (i.e., Si wafer) was used as the support. Using a wafer bonder EVG520IS (by EV Group), the circuit-bearing silicon wafer having the temporary adhesive layer and the Si wafer as support were vacuum joined at 25° C., below 10$^{-3}$ mbar and load 5 kN so that the temporary adhesive layer mated with the Si wafer as support. In this way, a wafer laminate was produced.

Example 9

A wafer laminate was produced as in Example 8 except that the member which was coated with photocurable silicone resin solution A1 as light irradiated was changed from the circuit-bearing Si wafer to the Si wafer as support.

Example 10

A wafer laminate was produced as in Example 8 except that the member which was coated with photocurable silicone resin solution A1 as light irradiated was changed from the circuit-bearing Si wafer to both the circuit-bearing Si wafer and the Si wafer as support.

Example 11

A wafer laminate was produced as in Example 8 except that the photocurable silicone resin solution used was changed from A1 to A6.

Example 12

A wafer laminate was produced as in Example 9 except that the photocurable silicone resin solution used was changed from A1 to A6.

Example 13

A wafer laminate was produced as in Example 10 except that the photocurable silicone resin solution used was charged from A1 to A6.

The wafer laminates obtained in Examples 8 to 13 were examined by the same tests as (1) wafer warpage test to (6) clean-away test. The results are shown in Table 3.

For (7) peeling (release) force test and (8) measurement of storage elastic modulus, a test sample was prepared by spin coating the photocurable silicone resin solution as light irradiated onto a silicon wafer of diameter 200 mm and thickness 770 μm (i.e., Si wafer), and heating on a hot plate at 100° C. for 5 minutes to cure the silicone resin layer. Thereafter, the peeling (release) force test and measurement of storage elastic modulus were carried out as above, with the results shown in Table 3.

TABLE 3

|  | Example | | | | | |
|---|---|---|---|---|---|---|
|  | 8 | 9 | 10 | 11 | 12 | 13 |
| Substrate | circuit-bearing Si wafer | | | circuit-bearing Si wafer | | |
| Support | Si wafer | | | Si wafer | | |
| Silicone resin solution | A1 | | | A6 | | |
| Curing conditions of temporary adhesive layer | 100 mW/cm$^2$ × 20 sec. = 2,000 mJ/cm$^2$ (23° C.) | | | | | |
| Surface coated with silicone resin solution | circuit-bearing Si wafer | Si wafer | circuit-bearing Si wafer/ Si wafer | circuit-bearing Si wafer | Si wafer | circuit-bearing Si wafer/ Si wafer |

TABLE 3-continued

| | Example | | | | | |
|---|---|---|---|---|---|---|
| | 8 | 9 | 10 | 11 | 12 | 13 |
| Thickness of temporary adhesive layer (μm) | 62 | 61 | 31/32 | 63 | 60 | 29/31 |
| Wafer warpage | ○ | ○ | ○ | ○ | ○ | ○ |
| Bond | ○ | ○ | ○ | ○ | ○ | ○ |
| Back surface grinding resistance | ○ | ○ | ○ | ○ | ○ | ○ |
| CVD resistance | ○ | ○ | ○ | ○ | ○ | ○ |
| Peeling | ○ | ○ | ○ | ○ | ○ | ○ |
| Clean-away | ○ | ○ | ○ | ○ | ○ | ○ |
| Peering force of silicone resin layer — Substrate | | Si wafer | | | Si wafer | |
| Peering force of silicone resin layer — Peeling force (gf) | | 20 | | | 23 | |
| Storage elastic modulus of silicone resin layer — Substrate | | Si wafer | | | Si wafer | |
| Storage elastic modulus of silicone resin layer — Elastic modulus (×10$^5$ Pa) | | 0.40 | | | 0.32 | |

As shown in Table 3, the embodiment of the inventive thin wafer manufacturing method involving the steps of applying a previously light-irradiated silicone resin solution and bonding achieves equivalent wafer processability to the embodiment involving the steps of applying, bonding and then light irradiating. Since this embodiment eliminates the need for light irradiation through the support, several advantages are contemplated, for example, the range of acceptable support is broadened and light damage to device wafers is avoided.

The invention claimed is:

1. A wafer processing temporary adhesive for temporarily bonding a wafer to a support, comprising a photocurable silicone resin composition containing a non-functional organopolysiloxane,
   wherein the photocurable silicone resin composition comprises:
   (A) 100 parts by weight of an organopolysiloxane having at least two alkenyl groups per molecule,
   (B) an organohydrogenpolysiloxane having at least two silicon-bonded hydrogen atoms (i.e., SiH groups) per molecule, in such an amount that a molar ratio of the total of SiH groups in component (B) to the total of alkenyl groups in component (A) is from 0.3 to 10,
   (C) 0.1 to 200 parts by weight of the non-functional organopolysiloxane, and
   (D) a photo-activatable hydrosilylation reaction catalyst in such an amount as to provide 0.1 to 5,000 ppm of metal atom based on the total weight of components (A), (B), and (C).

2. The wafer processing temporary adhesive of claim 1 wherein the non-functional organopolysiloxane as component (C) has a viscosity of 100 to 500,000 mPa·s as measured in 30% by weight toluene solution at 25° C.

3. The wafer processing temporary adhesive of claim 1 wherein the photocurable silicone resin composition further comprises (E) a hydrosilylation reaction inhibitor in an amount of 0.001 to 10 parts by weight relative to the total weight of components (A), (B), and (C).

4. The wafer processing temporary adhesive of claim 1 wherein the photocurable silicone resin composition shows a 180° peeling force of from 2 gf to 50 gf when tested by curing the photocurable silicone resin composition to form a test film of 25 mm wide, bonding the test film to a silicon substrate, and peeling back the film at 180° and 25° C.

5. The wafer processing temporary adhesive of claim 1 wherein the photocurable silicone resin composition as cured has a storage elastic modulus at 25° C. of from 1,000 Pa to 1,000 MPa.

6. A method for manufacturing a thin wafer, comprising the following steps (a) to (e) using a photocurable silicone resin composition containing a non-functional organopolysiloxane, wherein
   the steps (a) and (b) of bonding a wafer to a support via a temporary adhesive layer and curing are performed in either one of the following embodiments, and steps (c) to (e) are common in both the embodiments,
   embodiment (1):
   (a1) providing a wafer having a circuit-forming surface on a front side and a non-circuit-forming surface on a back side, applying the wafer processing temporary adhesive of claim 1 to the circuit-forming surface of the wafer and/or the wafer-facing surface of the support and bonding them to construct a wafer laminate,
   (b1) photocuring the temporary adhesive in the wafer laminate, embodiment (2):
   (a2) irradiating light to the wafer processing temporary adhesive composition,
   (b2) providing a wafer having a circuit-forming surface on a front side and a non-circuit-forming surface on a back side, applying the irradiated wafer processing temporary adhesive composition from step (a-2) to the circuit-forming surface of the wafer and/or the wafer-facing surface of the support and bonding them to construct a wafer laminate,
   (c) grinding or polishing the non-circuit-forming surface of the wafer in the wafer laminate,
   (d) processing the non-circuit-forming surface of the wafer, and
   (e) peeling the processed wafer from the support.

7. A wafer laminate comprising a support, a temporary adhesive layer disposed thereon and obtained from the wafer processing temporary adhesive of claim 1, and a wafer disposed thereon, the wafer having a circuit-forming surface on a front side and a non-circuit-forming surface on a back side,
   the temporary adhesive layer being releasably bonded to the front surface of the wafer.

* * * * *